United States Patent [19]

Ishii et al.

[11] Patent Number: 4,702,556

[45] Date of Patent: Oct. 27, 1987

[54] METHOD OF ASSEMBLING A LIGHT EMITTING DEVICE WITH AN OPTICAL FIBER

[75] Inventors: Satoru Ishii, Tamamura; Tugio Nemoto; Kunio Aiki, both of Takasaki, all of Japan

[73] Assignees: Hitachi, Ltd.; Hitachi Iruma Electronic Co., Ltd., both of Tokyo, Japan

[21] Appl. No.: 643,259

[22] Filed: Aug. 22, 1984

[30] Foreign Application Priority Data

Aug. 22, 1983 [JP] Japan .................. 58-151575

[51] Int. Cl.⁴ ................................. G02B 6/42
[52] U.S. Cl. .................... 350/320; 350/96.20
[58] Field of Search ............ 350/96.15, 96.20, 320

[56] References Cited

U.S. PATENT DOCUMENTS

| | | | |
|---|---|---|---|
| 4,237,474 | 12/1980 | Ladany | 350/96.20 |
| 4,295,152 | 10/1981 | Khoe et al. | 350/96.21 |
| 4,296,998 | 10/1981 | Dufft | 350/96.20 |
| 4,355,323 | 10/1982 | Kock | 350/96.20 |
| 4,357,072 | 11/1982 | Goodfellow et al. | 350/96.20 |
| 4,435,037 | 3/1984 | Abrahamson et al. | 350/96.20 |

FOREIGN PATENT DOCUMENTS

| | | | |
|---|---|---|---|
| 3010820 | 9/1981 | Fed. Rep. of Germany | 350/96.20 |
| 0133583 | 10/1980 | Japan | 350/96.20 |
| 0067678 | 4/1984 | Japan | 350/96.20 |
| 2128768 | 5/1984 | United Kingdom | 350/96.20 |

OTHER PUBLICATIONS

Bailey et al., "Method and Apparatus to Align and Affix an Optical Fiber and Laser or LED", *Xerox Discl. Journal*, vol. 4, No. 3, May/Jun. 1979, pp. 387-388.

*Primary Examiner*—John Lee
*Attorney, Agent, or Firm*—Antonelli, Terry & Wands

[57] ABSTRACT

A light emitting device including a light emergence device, an optical fiber for receiving light emerging from the light emergence device, and an optical fiber supporting member having a groove or hole for accommodating and fixing the optical fiber. The support member is adapted to be deformed when subjected to an external force so as to enable an alignment of the optical axes of the light emergence device and the optical fiber.

14 Claims, 11 Drawing Figures

METHOD OF ASSEMBLING A LIGHT EMITTING DEVICE WITH AN OPTICAL FIBER

BACKGROUND OF THE INVENTION

The present invention relates to light emitting devices and, more particularly, to a light emitting device effective as a light emitting source for optical communications.

In, for example, appicants' U.S. Ser. No. 524,324 (abandoned) a laser diode device with an optical fiber is proposed which employs a laser diode chip. However, it has been determined that in this proposed device, in some instances, there is a deviation in the optical axis of the optical fiber and the chip thereby resulting in a non-conforming product.

The aim underlying the present invention essentially resides in providing a light emitting device having a high photocoupling efficiency between a light emitting element and an optical fiber for transmitting radiation emitted from the light emitting element out of the light emitting device.

An object of the present invention resides in providing a light emitting device which has a high available precentage of production and which minimizes the occurrence of defective light emitting devices.

In accordance with advantageous features of the present invention, an optical communication device is provided wherein a light emitting chip element and a photocoupled end part of an optical fiber are fixedly disposed in opposition to each other along a principal or main surface of a stem, with the photocoupled end part of the optical fiber extending through a resin provided in a hole or opening formed in a flexible support member fixed to the stem. The photocoupled state between the chip element and the optical fiber is tested while the radiation is emitted from the chip element, and when the test reveals an inferior photocoupled state, an external force is exerted in a desired direction on the head part of the support member so as to readjust the position of the photocoupled end of the optical fiber, whereby the photocoupling efficiency can be significantly enhanced. Consequently, it is possible to provide a high percentage production of the optical communication devices with each of the devices having a favorable photocoupling efficiency.

DETAILED DESCRIPTION

Figure 1:
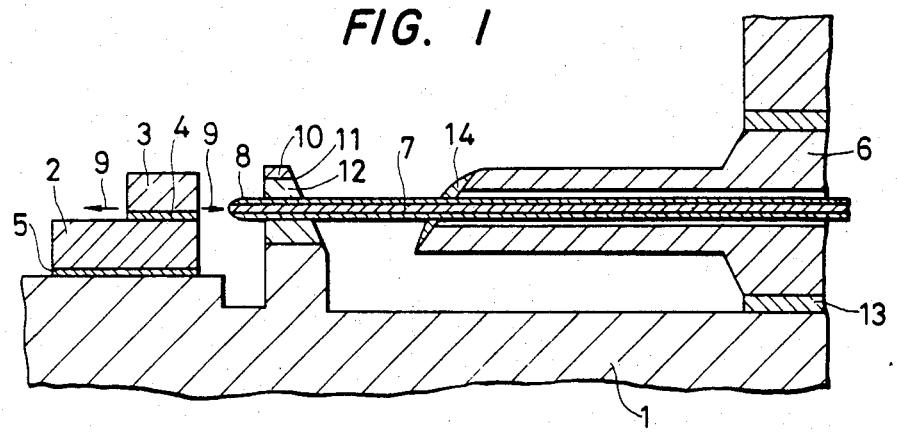
FIG. 1 is a cross-sectional view of a laser diode device with an optical fiber constructed in accordance with U.S. Ser. No. 524,324; (abandoned)

Referring now to the drawings wherein the reference numerls are used throughout the various views to designate like parts and, more particularly, to FIG. 1, according to this figure, a laser diode device of the type proposed in U.S. Ser. No. 524,324 (abandoned) includes a laser diode chip 3 fixed to a principal or main surface of a stem 1 by a submounting member 2 by, for example, solder 4, 5. An optical fiber 7 is supported by a fiber grade 6, fixed to and extending through a peripheral wall of the stem 1, with a photocoupled end 8 of the optical fiber 7 confronting an exit face of the chip 3. Laser radiation 9, emerging from the exit face of the chip is received in the optical fiber 7 from the photocoupled end thereof, and is transmitted out of the laser diode device, with the optical ber 7 being employed as a transmission medium of the laser radiation 9. Additionally, the photocoupled end of the optical fiber 7 is inserted in a hole or opening 11 formed in a projecting support member 10 provided in the principle surface of the stem 1, with the photocoupled end 8 being fixed by a fixing material such as, for example, a resin or solder 12 which fills the hole or opening 11. The hole or opening 11 is designed or constructed such that a center thereof corresponds to a central part of the exit face of the chip 3, and the optical fiber 7, inserted in the hole or opening 11, has a hole circumference thereof drawn out by a uniform force when the fixing material is cured, whereby the optical fiber can be located at the center of the hole or opening 11 even after a curing of the fixing material 12. Therefore, the light receiving efficiency or photocoupling efficiency of the fiber 7 is relatively high. The fiber grade 7 is hermettically fastened to the stem 1 with, for example, a silver paste 13, and the optical fiber 7 is fixed to the fiber grade 6 with, for example, a resin 14.

As noted above, with a laser diode device such as constructed in the manner illustrated in FIG. 1, the optical axes of the optical fiber 7 and the chip 3 sometimes deviate and efforts to reveal the causes for the deviation or misalignment of the optical axis resulted in discovering the following factors.

The alignment of the optical axes of the laser radiation 9 and the optical fiber 7 is carried out in such a manner that the photocoupled end of the optical fiber 7, inserted in the fiber guide 6, is inserted into the hole or opening 11 of the support member 10, whereupon the liquid resin fixing material 12 is packed in the hole or opening 11, with the optical fiber 7 being uniformly drawn or pulled in a peripheral direction thereof by the adhesive force of the resin 12 so as to be centrally located in the circular hole or opening 11. In aligning the optical axes, the fine front end part of the fiber guide 6 has a position thereof adjusted by applying an external force thereto, to seek the positon at which the laser radiation 9, emerging from the fixed chip and received into the optical fiber 7, can be maximized. When the position of the optical fiber 7 at which the maximum laser radiation 9 can be received is determined in this manner, the liquid resin fixing material 12 is poured into the hole or opening 11 and is thermally cured to fix the front end 8 of the optical fiber 7. Accordingly, immediately after the liquid resin fixing material 12 is packed into the hole or opening 11 and has been thermally cured, the optical axes of the laser radiation 9 and the optical fibers 7 should be at a state wherein the photocoupling efficiency is maximized. However, as noted above, in some instances, after the liquid resin fixing material 12 has been thermally cured, the position of the optical fiber sometimes deviates to the point of extensively lowering the light receiving efficiency thereof.

One reason for this deviation resides in the fact that when, before pouring liquid resin fixing material 12, the front end of the fiber guide 6 is deformed to align the optical axes of the optical fiber 7 and laser chip 3, a residual stress is created in the fiber guide 6, and, when heat is applied for thermally curing the fixing material 12, in some instances, the fiber guide 6, having the residual stress, is deformed so that the position of the front end part 8 of the optical fiber 7 deviates or fluctuates resulting in a misalignment of the optical axes.

The positional deviations of the optical fiber may also occur due to heat treatments at, for example, 70° C. which heat treatments occur for at least twenty minutes, and which heat treatments are involved in the connection between a lead and a gold wire, the sealing fixation or seam welding of a cap for hermetic sealing, etc. However, it has been determined that these positional deviations of the optical fiber 7 are infrequent, and that the misalignment of the optical axes is principally incurred during the thermal curing of the resin 12. It has been found that the deviation magnitude of the position of the optical fiber 7 arising on this occasion is approximately 0.2–0.4 μm and exceeds 0.1–0.2 μm, the allowable deviation value of the optical axes, so that an inferior alignment of the optical axes occurs.

Figure 2:
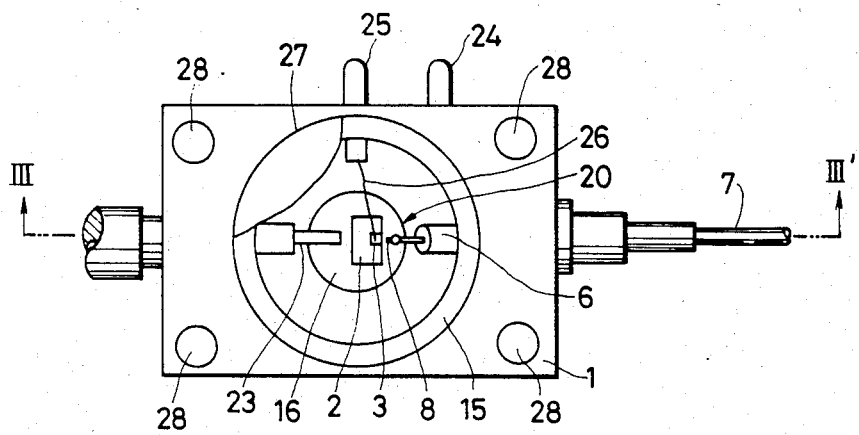
FIG. 2 is a plan view of a laser diode device with an optical fiber constructed in accordance with the present invention.
Figure 3:
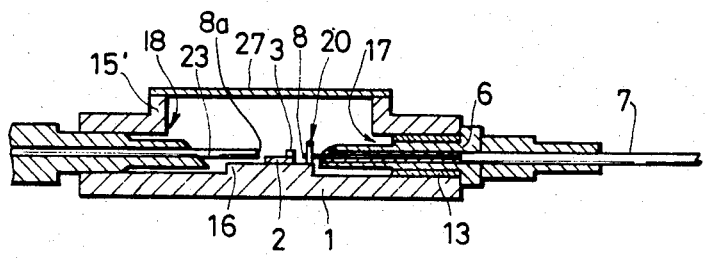
FIG. 3 is a cross-sectional view taken along the line III—III' in FIG. 2.

As shown most clearly in FIGS. 2 and 3, in accordance with the present invention, a stem 1, formed as an oblong metal plate, has one surface thereof machined so as to form a ring-shaped sealing wall 15 in a central part thereof, with an inner side of the ring-shaped sealing wall 15 being hollowed out to a still greater extent so as to form a pedestal portion 16 centrally of a bottom of the hollow.

Figure 4:
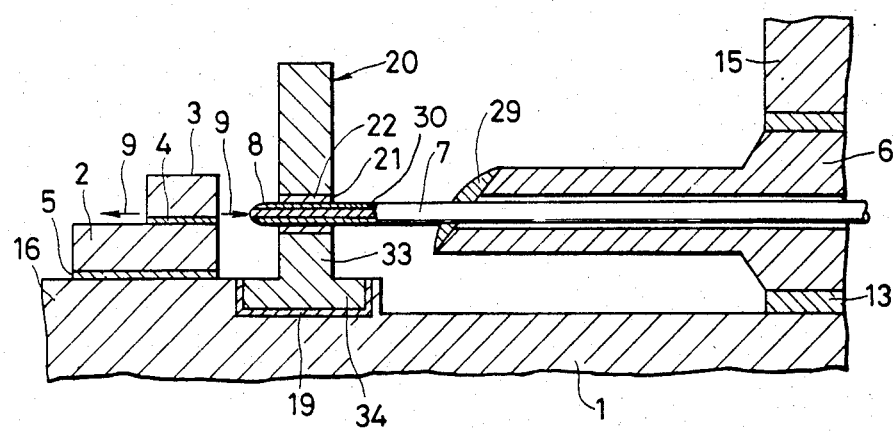
FIG. 4 is an enlarged cross-sectional view of a portion of the device of FIG. 2.

As shown in FIG. 4, the submount member 2 is fixed on the pedestal portion 16 by, for example, solder 5, with the laser diode chip 3 being fixed to the submount member 2 with, for example, solder 4. Guide holes generally designated by the reference numerals 17, 18 are respectively provided at both the ends of the stem 1, with the guide holes 17, 18 extending toward the exit faces of the chip 3 from which the laser radiation 9 emerges. A fiber guide 6, having a single-mode optical fiber 7 centrally and snugly inserted and fixed thereon, is fitted into one guide hole 17 and is fixed to the stem 1 with, for example, a silver paste 13. The front end of the optical fiber 7 confronts one exit face of the chip 3 so as to receive the laser radiation 9 into the optical fiber 7. A photocoupled end 8, at the front end of the optical fiber 7, is inserted into a circular hole 21 provided in a support member generally designated by the reference numeral 20 formed as a round rod of, for example, Kovar, with the support member 20 being fixed to the pedestal portion 16 of the stem 1 by, for example, a silver paste 19, and with the photocoupled end 8 being fixed in the hole 21 by a fixing material 22 packed therein.

A monitor fiber 23 is snugly inserted and fixed in the guide hole 18, with a front end portion 8a of the monitor fiber 23 confronting the other exit face of the chip 3 so as to monitor the light intensity of the laser radiation 9. To leads 24, 25 are disposed in the stem 1, with one lead 24 being a ground lead welded to the stem 1 and electrically connected to a lower electrode of the chip 3 through the stem 1 and the submount member 2, and the lead 25 being fixed to the stem 1 through an insulator (not shown) such as, for example, glass. An inner end of the lead 25 extends through the end face of the stem 1 to a space located interiorly of the ring-shaped sealing wall 15, with the inner ends of the lead 25 and upper electrode of the chip 3 being electrically connected by a lead or wire 26 made of, for example, gold. A flat cap 27 is hermetically mounted on a top of the ring-shaped sealing wall 15 by seam welding so as to hermetically encapsulate the chip 3, etc. Additionally, mounting holes 28, used during a packaging operation, are provided at least at four corners of the stem 1.

The laser diode device of the present invention may be manufactured in the following manner.

After the stem 1 has been prepared, the fiber guide 6, support member 20, and monitor fiber 23 are fixed with the silver paste 13. Thereafter, the submount member 2, to which the chip 3 is fixed, is positioned and fixed on the pedestal portion 16 of the stem 1 with the solder 5. The upper electrode (not shown) of the chip 3, disposed on the upper surface of the chip 3, and the lead 25 are connected by the wire 26.

Subsequently the optical fiber 7 is inserted into the fiber guide 6. and the photocoupled end 8 is inserted into the hole 21 of the support member 20 so as to confront the exit face of the chip 3. As shown in FIG. 4, in the front end part of the optical fiber 7, the clad layer of the optical fiber 7 is polished with a taper such as, for example, pencil tip, and the core thereof has its extreme end spherically worked so as to have a curvature. The spherically worked part of the core functions as a lens so that the laser radiation 9 can be efficiently received into the optical fiber 7. Next, using a fixing material 29 made of, for example, a resin, the optical fiber 7 is fixed at the front end part of the fiber guide 6, and the hole of the fiber guide 6 is closed.

In this state. with a predetermined voltage applied to the chip 3 so as emit light, an optical output is received in the optical fiber with the received optical output in the optical fiber 7 being detected. In order to maximize the optical output, the front end part of the fiber guide 6 is finely adjusted in a directions, whereby the photocoupled end 8 is adjusted so as to lie centrally of the hole 21. When the photocoupled end part 8 of the optical fiber 7 is positioned centrally of the hole 21, the photocoupling efficiency is maximized.

The liquid resin fixing material 22 is packed into the hole 21 of the support member 20, which fixing material 22 has an adhesive force. The optical fiber 7 may, for example, have an outside diameter of, for example, 125 μm, with a diameter of the hole 21 being, for example, 400 μm and they are proximate. Therefore, a pulling force acts between a peripheral surface of the optical fiber 7 and that of the hole 21 due to the adhesive force of the fixing material 22. Additionally, since the hole 21 is circular in cross section, the fixing material 22, existing in the whole peripheral part of the optical fiber 7, is uniformly distributed so that the whole peripheral surface is radially pulled or drawn by a uniform force, and the optical fiber 7 is automatically centrally positioned in the hole 21.

A heat treatment is then performed so as to cure the fixing material 22 in the hole 21. The temperature of the heat treatment is set at a low temperature of, for example, 70° C. in order to prevent a degradation of a jacket 30 which covers the optical fiber 7.

Figure 5:
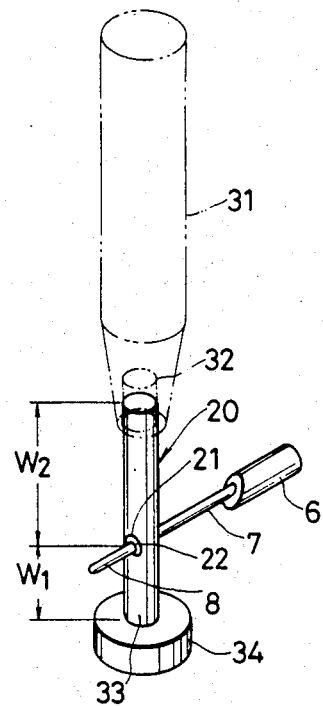
FIG. 5 is a perspective view of an arrangement for adjusting a position of a support member of the device of FIG. 2.

Next, a detection of the optical fiber is once again executed or carried out and, if the optical output has decreased, as shown in FIG. 5, the support member 20 is slightly curved with a correcting tool 31. As can readily be appreciated, other means than the correcting tool 31 may be used for carrying out the corrective alignment. The correcting tool 31 is provided, at a lower end surface thereof, with an inserting hole 32 for accommodating the support member 20, with the correcting tool 31 being fitted on the support member 20 so as to receive a head portion of the support member 20 in the inserting hole 32, whereupon the support member 20 is slightly bent or inclined to adjust the photocoupled end 8 so that the optical output in the optical fiber 7 is mamimized. When the head part of the support member 20 is inclined or bent downwardly toward the chip 3, the photocoupled end 8 swings in a downward direction and, when the head part of the support member 20 is displaced in the opposite direction, the photocoupled end 8 moves in an upward direction. Additionally, when the head part of the support member 20 is moved in a lateral direction, the photocoupled end 8 moves laterally along the principle surface of the stem 1. The height $W_1$ of the hole 21 of the support member 20 and the length $W_2$ from the hole 21 to the head part of the support member 20 is advantageously set at relatively great values so as to prevent the correcting tool 31 from touching and breaking the optical fiber 7 when the support member 20 is bent or inclined downwardly. For this reason, the relationship between $W_1$ and $W_2$ should desireably be $W_2 > W_1$. Additionally, when the head part of the support member 20 is subjected to a force, the support member 20 curves or bends from the root part thereof, and the extent of curve or the extent of fall increases toward the head part. Consequently, as $W_2$ is made greater, a slighter force for moving the tool 31 is sufficient for adjusting the position of the front end of the optical fiber 7, so as to facilitate adjustments. In order to permit the support member 20 to be easily plastically deformed with a relatively small force, the support member 20 has a small diameter of, for example, 1 mm, and, in order to prevent the support member 20 from deviating or fluctuating in a positional relationship with respect to the chip 3. etc., due to heat, the support member 20 is made of the same material such as, for example, Kovar as that of the stem as well as the fiber guide 6 to provide identical coefficients of thermal expansion. In this connection, Kovar is well suited as a material for the support member 20 because of minimal plastic deformation of the material when heat is applied thereto. Advantageously, the support member includes a slender deformation portion 33 which has a hole 21 and which is deformable, and a flat base portion 34 which is fixed to the stem 1; however, as can well be appreciated the support member may have another configuration as will be described more fully hereinbelow.

The cap 27 may also, for example, be made of Kovar, with the cap 27 being adapted to be placed on the ring-shaped sealing wall 15 and being adapted to be hermetically fixed by, for example, seam welding.

Figure 6:
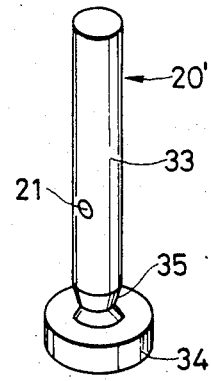
FIG. 6 is a perspective view of another embodiment of a support member for a laser diode device constructed in accordance with the present invention.

FIG. 6 provides an example of another support member generally designated by the reference numeral 20′, wherein a root portion of the deformation portion 33 adjoining the base portion 34 is fashioned as a constricted portion 35 so as to be readily bent or curved. The constriction portion 35 is easily curved or bent because it gives rise to a stress concentration when an external force is applied to the head part of the support member 20′. Since the deformation portion 33 is provided with the hole 21 for enabling an insertion of the optical fiber 7, the part formed with the hole 21 also causes a stress concentration even when the optical fiber 7 and the fixing material 22 are received therein. In some cases, the support member 20′ might break down in an area of the hole 21; however, when the constriction portion 35 is provided, the stress concentration in the constriction portion 35 is greater and the support member 20′ curves or bends in the constriction portion 35 which is effective to prevent an occurence of a breakdown of the support member 20′.

Figure 7:
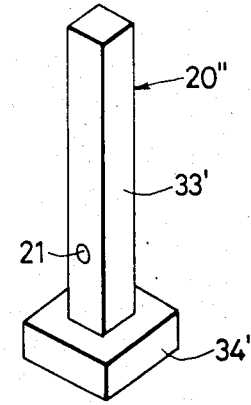
FIG. 7 is a perspective view of yet another embodiment of a support member for a laser diode device constructed in accordance with the present invention.

In the embodiment of FIG. 7, a deformation portion 33′ and a base portion 34′ of a support member generally designated by the reference numeral 20″ each have a rectangular cross-sectional configuration, however, the embodiment of FIG. 7 achieves similar effects to the effects achieved in the embodiment of FIGS. 2–4, that is, the support member 20″ may well have a cross-sectional configuration other than a round rod configuration. Since the embodiment of FIG. 7 has a rectangular base portion 34′, it is possible to readily effect a correct orientation of the support member 20″ when fastening the same to the stem 1.

Figure 8:
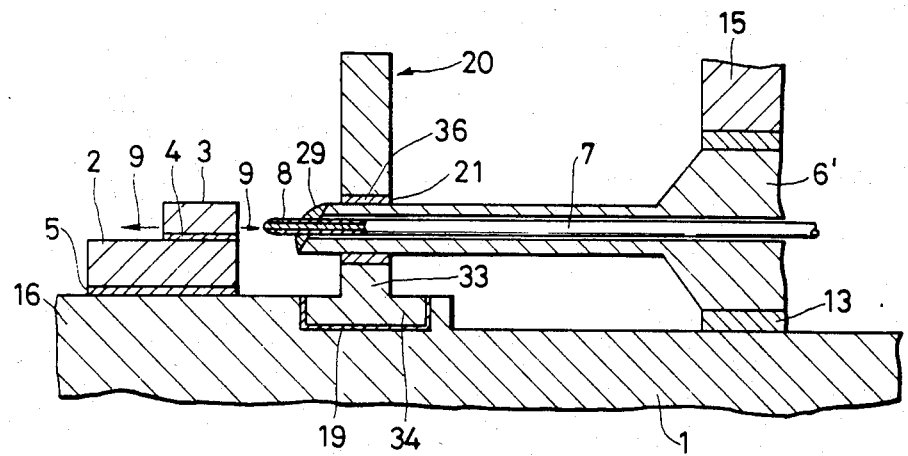
FIG. 8 is a cross-sectional view of a laser diode device with an optical fiber constructed in accordance with another embodiment of the present invention.
Figure 9:
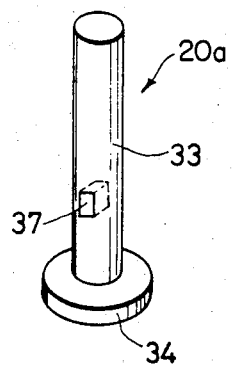
FIG. 9 is a perspective view of an optical fiber support member for a further embodiment of a laser diode device constructed in accordance with the present invention.

In the embodiment of FIG. 8, a fiber guide 6′ penetrates or extends through a hole 21 provided in the support member 20 and is fixed therein by, for example, a silver paste 36. A diameter of the fiber guide 6′ was, for example, 500 μm, with a diameter of the hole 21 being, for example, 800 μm. The support member 20, the fiber guide 6′, and the stem 1 are made of the same material such as, for example, Kovar so as to prevent fluctuations or deviations in the positional relationship with respect to the chip 3, etc. due to heat. By virtue of the fact that the support member 20, fiber guide 6′, and stem 1 are made of the same material, each of these elements would have identical coeficients of thermal expansion. Since, in the embodiments described hereinabove, the optical fiber 7, which is made of silica, is directly fixed in the hole 21 of the support member 20, the silver paste 36 would be unsuitable as a fixing material since, with the silver paste 36, large thermal stresses act on the optical fiber 7. In contrast, according to the embodiment of FIG. 8, the fiber guide 6 is extended so as to fix the optical fiber 7 in the hole 21 of the support member 20 through the fiber guide 6′, so that the silver paste 36 can be used as the fixing material. The silver paste 36 has a favorable bonding property with the fiber guide 6′ and has a higher reliability than a resin. Due to the construction of FIG. 8, the coefficients of thermal expansion of the contract parts between the stem 1 and the fiber support member 20, and between the fiber guide 6′ and the fiber support member 20 become substantially equal, and the thermal stress tending to act on the optical fiber 7 can be reduced to a very small level. Furthermore, a mechanical stress which is exerted from the support member 20 in finally adjusting optical axes after a fixation of the optical fibers 7 is absorbed to some extent by the extended fiber guide 6', so that any excess mechanical stress does not act on the optical fiber 7. Consequently, it is possible to prevent the degradation of the photocoupling efficiency and also enhance the reliability of the device. The support member for supporting the optical fiber 7 may well be made unitary with the stem 1 by machining a stem material at the formation of the stem 1 without being formed as a separate component. Since, in this case, the positional accuracy of the support member relative to the stem 1 would be based upon the machine operation, it is possible to attain a higher accuracy. Additionally, the optical fiber 7 is fixed in the hole formed in the support member and the hole need not always be circular but, as shown in FIG. 9, a support member generally designated by the reference numeral 20a may be provided having, for example, a square hole 37.

Figure 10:
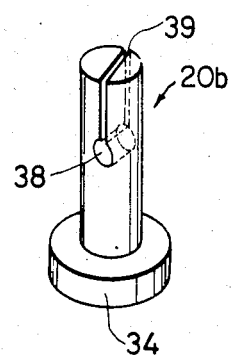
FIG. 10 is a perspecetive view of another embodiment of an optical fiber support member for a laser diode device constructed in accordance with the present invention.

It is also possible, as shown in FIG. 10, to provide a support member generally designated by the reference numeral 20b having a hole 38 provided with a fine slot 39 through which the silver paste 36 is poured. It is also possible to provide a construction wherein, rather than a hole, the optical fiber 7 may be supported by a groove or protrusion (not shown) provided in the support member. Furthermore, with regard to the fixing material for fixing the optical fiber 7, even with a special solder which is used for bonding a glass, the optical fiber 7 can be positioned and fixed centrally of the circular hole by the adhesive force of the solder.

Figure 11:
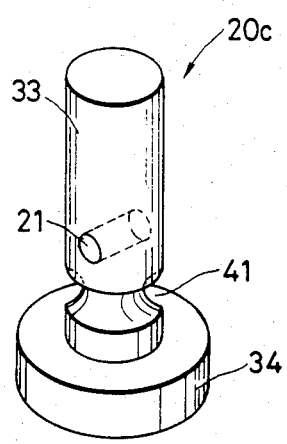
FIG. 11 is a perspective view of an optical fiber support member of still another embodiment of the present invention.

As shown in FIG. 11, a support member generally designated by the reference numeral 20c may be provided with a constriction portion 41. In this construction it has been determined through experimental study that with a constriction portion 41, the support member 20c is suitable for practical use in that, when a force is applied to the head part of the support member 20c, a movement of the deformation portion 33 can be carried out easily so as to facilitate the adjustment of the optical fiber 7, and that, when heat is applied, the plastic deformation of the support member 20c itself is relatively small. More particularly, the experiments were conducted with various components having the following dimensional relationships. A diameter of the support member 30 was 1 mm, a height of the deformation portion 33 from the upper surface of a pedestal portion 34 was 2.6 mm, a diameter of the hole 21 was 0.4 mm, a diameter of the pedestal portion 34 was 1.8 mm, a length of the top of the support member to a center of the hole was 1.5 mm, a width of the constriction portion 41 was 0.4 mm, a smallest diameter of the constriction portion 41 as 0.6 mm, a length from a center of the hole 21 to a middle of the constriction portion 41 was 0.6 mm, and a height from the upper surface of the pedestal portion to a center of the constriction portion 41 was 0.45 mm.

After an optical fiber 7 has been fixed, the position of the photocoupled end part 8 for receiving the light can be corrected. Therefore, even when the positional deviation of the optical fiber 7 has occurred during the fixation of the optical fiber 7, etc., the optical axes of the chip 3 and the optical fiber 7 can be aligned at the final assembly stage before packaging, so that a laser diode device of high photocoupling efficiency can be provided.

By virtue of the above-noted effects, the photocoupled state can be adjusted at the final stage of assembly, so that the occurrence of the misalignment of the optical axes can be reduced, and the enhancement of available percentage is achieved.

Moreover, with the invention, the adjustment of the optical axes alignment of the optical fiber 7 with respect to the chip 3 can be simply made by merely bending a support member supporting the optical fiber 7 in the desired direction so that the production efficiency is increased.

Furthermore, the photocoupled end part 8 of the optical fiber 7 is accommodated in a circular hole 21, and is supported in a state in which the whole periphery of the optical fiber 7 is uniformly pulled or drawn by a liquid fixing material 22. Therefore, the optical fiber 7 is automatically centrally positioned in the hole 21, the positional accuracy of the photocoupled end 8 becomes high, and the ratio of acceptance as to the optical axis alignment of the optical fiber 7 to the chip 3 increases. Accordingly, the optical axis alignment correcting operation in which the support member is bent need not always be performed for all products, and the number of man hours for the assembly of the device can be reduced.

Additionally, when the support member 20 for supporting the optical fiber 7 is provided with a constriction portion 35 at a lower part thereof, a stress concentration easily arises, and the bending correction of the support member is facilitated.

Also, with the support member being formed of the same material as that of the stem 1 and fiber guide 6 for supporting the optical fiber 7, it is possible to equalize the coefficients of thermal expansion. Therefore, even when a temperature change arises, the positional relationship between the chip 3 and the optical fiber 7 does not change, and a stable optical communication can be maintained.

Furthermore, with a construction such as proposed by the present invention wherein the fiber guide 6' is extended to the fiber fixing hole 21 of the support member 20 and the optical fiber 7 is fixed with a silver paste 36 through the fiber guide 6', the coefficients of thermal expansion of the contact parts or areas between the stem 1 and the fiber support member 20 and between the fiber guide 6' and the fiber support member 23 become substantially equal so as to enable a reduction in a thermal stress acting on the optical fiber 7. Moreover, since the fiber guide 6' absorbs a mechanical stress to some extent, any excess mechanical stress does not act on the optical fiber 7. Therefore, the effect of preventing the degradation of the photocoupling efficiency is further enhanced.

While in the above, the invention has been chiefly described as being applied to an optical communication technology employing a laser diode, as can readily be appreciated, the invention is not restricted thereto but rather the invention is applicable to, for example, an optical communication technology employing a light emitting diode or a light emitting device in which a light emitting element such as a laser diode or light emitting diode is assembled. Thus, the present invention is applicable to any device which meets at least the condition that a light emitting element and an optical fiber are assembled.

While we have shown and described several embodiments in accordance with the present invention, it is understood that the same is not limited thereto but is susceptible of numerous changes and modifications as known to one having ordinary skill in the art, and we therefore do not wish to be limited to the details shown and described herein, but intend to cover all such modifications as are encompassed by the scope of the appended claims.

We claim:

1. A method of assembling a light emitting device with an optical fiber comprising the steps:
   (a) preparing a stem having a pedestal portion;
   (b) fixing supporting means for an optical fiber on said stem, said supporting means having a hole and being deformable in three orthogonal directions;
   (c) mounting a laser diode chip on said pedestal portion of said stem;
   (d) inserting a portion of the optical fiber into said hole and fixing said optical fiber immovably in said hole, and after the step (d);
   (e) manipulating said supporting means in any one or more of the three orthogonal directions while observing light output from the optical fiber to determine an optimum position of a photocoupled end part of said optical fiber relative to a light emitting portion of said laser diode chip and fixing the supporting means in the optimum position.

2. The method as claimed in claim 1, wherein said supporting means includes a round rod-shaped support member.

3. The method as claimed in claim 1, wherein said laser diode chip is a semiconductor laser diode chip.

4. The method as claimed in claim 1, wherein said end part of said optical fiber is polished with a taper.

5. The method as claimed in claim 1, wherein the step of fixing the optical fiber is carried out by a resin which fills said hole.

6. The method as claimed in claim 1, wherein the step of fixing the optical fiber carried out by a silver paste which fills said hole.

7. The method of claim 1, wherein said supporting means and said stem are made from the same material.

8. A method of assembling a light emitting device with an optical fiber comprising the steps:
   (a) fixing supporting means for an optical fiber on an attachment means, said supporting means having a hole and being deformable in three orthogonal directions;
   (b) mounting a light emitting means on a portion of said attachment means;
   (c) inserting a portion of the optical fiber into said hole and fixing said optical fiber immovably in said hole, and after the step (c);
   (d) manipulating said supporting means in any one or more of the three orthogonal directions while observing light output from the optical fiber to determine an optimum position of a photocoupled end part of said optical fiber relative to a light emitting portion of said light emitting means and fixing the supporting means in the optimum position.

9. The method as claimed in claim 8, wherein said supporting means includes a round rod-shaped support member.

10. The method as claimed in claim 8, wherein said light emitting means is a semiconductor laser diode chip.

11. The method as claimed in claim 8, wherein said and part of said optical fiber is polished with a taper.

12. The method as claimed in claim 8, wherein the step of fixing the optical fiber is carried out by a resin which fills said hole.

13. The method as claimed in claim 8, wherein the step of fixing the optical fiber is carried out by a silver paste which fills said hole.

14. The method of claim 8, wherein said supporting means and said attachment means are made from the same material.

* * * * *